United States Patent [19]

Prater

[11] 3,970,198

[45] July 20, 1976

[54] PRINTED CIRCUIT BOARD RETAINER

[75] Inventor: Earle Francis Prater, Long Beach, Calif.

[73] Assignee: The Birtcher Corporation, Los Angeles, Calif.

[22] Filed: Feb. 3, 1975

[21] Appl. No.: 546,811

[52] U.S. Cl. .............................. 211/41; 339/75 MP
[51] Int. Cl.² ........................................... A47G 19/08
[58] Field of Search .......... 211/40, 42; 317/101 DH; 339/17 LM, 17 L, 65, 66, 75 MP; 24/263 LL, 263 B, 263 SW, 67 R

[56] References Cited
UNITED STATES PATENTS

| 1,573,443 | 2/1926 | Hallar et al. | 24/263 B |
| 2,857,577 | 10/1958 | Vanderpool | 339/75 MP |
| 3,129,990 | 4/1964 | Rice et al. | 339/17 LM |
| 3,475,717 | 10/1969 | Lane | 339/75 MP |
| 3,639,888 | 2/1972 | Pittman et al. | 339/75 MP |
| 3,845,359 | 10/1974 | Fedele | 211/41 |

OTHER PUBLICATIONS
IBM Tech. Bulletin, Cammed Connector, Uberbacher 8-1966.

Primary Examiner—Robert A. Hafer
Attorney, Agent, or Firm—Jackson & Jones

[57] ABSTRACT

A printed circuit board retainer for use in a rack or the like is provided comprising a housing member having an elongated slot adapted to receive a printed circuit board. A series of cam ramps are provided within the interior of the housing member. Mounted within the housing member is an elongated cam member adapted to move relative to the cam ramp of the housing member. The cam member has a plurality of follower ramps that are designed to bear against the cam ramps of the housing member. A lever member is pivotally mounted at one end of the housing member for actuating the cam member. The cam member as a result of the coaction of the follower and cam ramps is capable of exerting a retaining force in a direction traverse to the face of the printed circuit board.

16 Claims, 3 Drawing Figures

U.S. Patent July 20, 1976 3,970,198
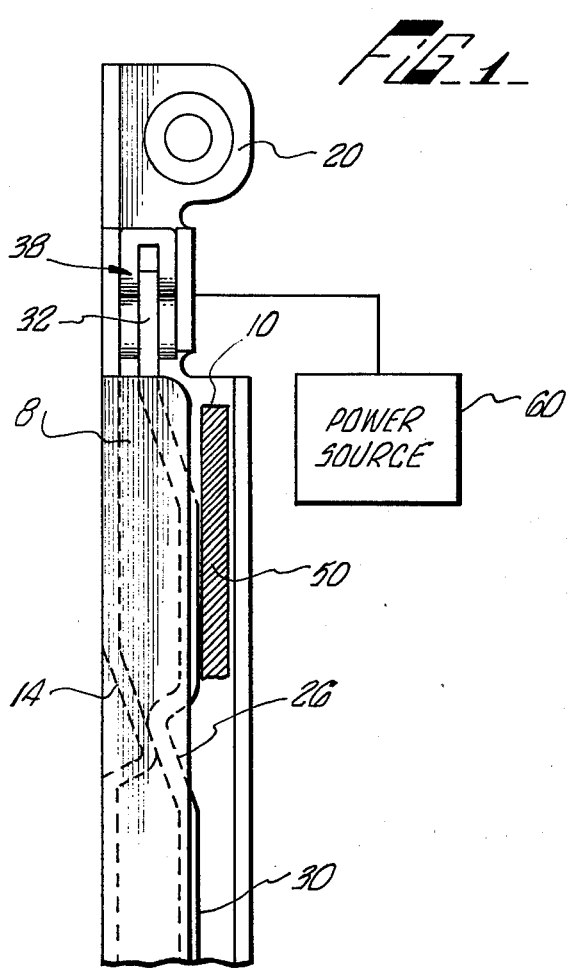
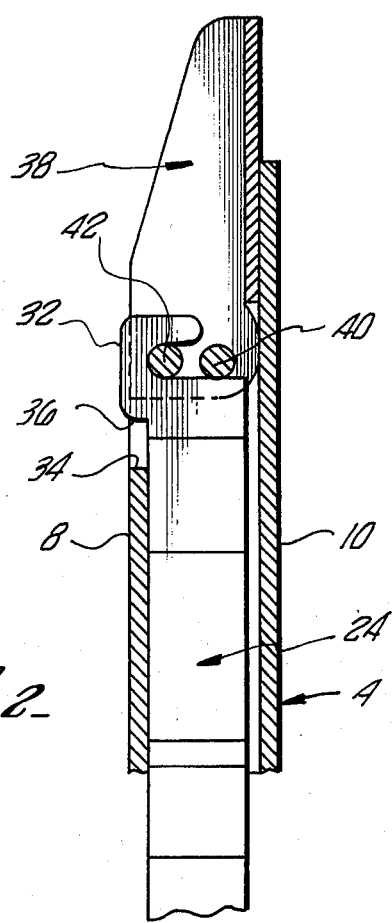
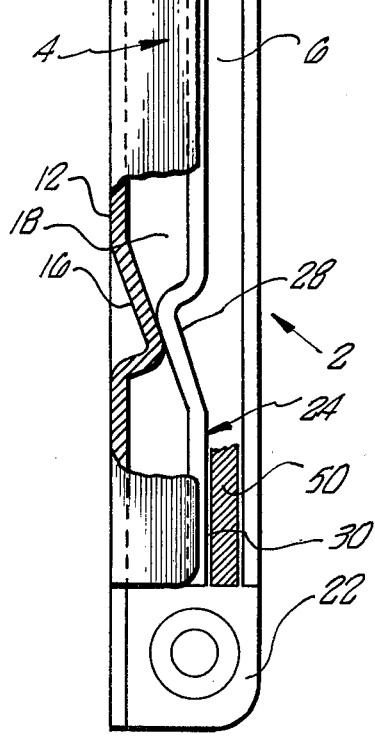
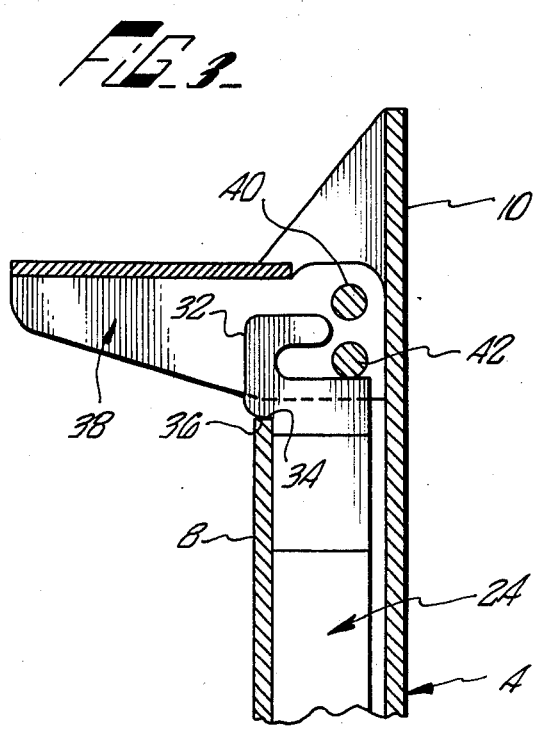

PRINTED CIRCUIT BOARD RETAINER

BACKGROUND OF THE INVENTION

1. Field of the Invention

The present invention relates to a printed circuit board retainer and more particularly to a relatively easily manufactured mounting device for removably retaining a printed circuit board in a rack.

2. Description of the Prior Art

The increased use of printed circuit boards in both consumer and industrial applications has created a large demand for relatively inexpensive mounting or retaining devices that can retain printed circuit boards in an operaive position. Various forms of racking systems such as the BIRTCHER 58 series P.C.B. racks have evolved for mounting printed circuit boards. The trend in today's technology is to develop smaller and smaller circuit elements which will occupy a minimum of space. At the same time the number of circuit boards utilized in any installation has become greater.

Since a prime advantage in the utilization of printed circuit boards is their capability of permitting a fast assembling and replacement of circuit elements as a group, it has become necessary to provide various mounting arrangements which are capable of removably retaining the printed circuit board. Accordingly, there is a need for a relatively inexpensive and easily manufactured printed circuit board retainer for removably retaining the circuit boards of today's technology.

The retainer disclosed in the Kerschbaum U.S. Pat. No. 3,664,510 is one illustration of an attempt to retain printed circuit boards in an inexpensive fashion. Flexible plastic elements are mounted on a metal frame to resiliently receive and hold the printed circuit boards in a rack. The Athey U.S. Pat. No. 3,829,741 discloses another form of plastic support member for retaining a printed circuit board.

The Beale U.S. Pat. No. 3,451,034 discloses a printed circuit board ejection and locking mechanism for removably retaining a printed circuit board in an operative state.

The Drenten et al. U.S. Pat. No. 3,550,062, Berg U.S. Pat. No. 3,541,494, Marconi U.S. Pat. No. 3,714,513 and Miller U.S. Pat. No. 3,594,684 are cited of general interest.

Finally, the Pearl U.S. Pat. No. 3,014,258 is cited simply of general interest to disclose a clamping device.

SUMMARY OF THE INVENTION

The present invention is directed to a printed circuit board retainer consisting of basically three operative parts. One of the parts is an elongated member having at least one follower ramp and a planar bearing surface. The elongated member is movably mounted within a housing member having at least one appropriately positioned complementary cam ramp for coacting with the follower ramp. An opening is provided in the housing to permit the zero force insertion of a printed circuit board to extend into and at least partially across the elongated member. A cam lever is mounted on the housing member and is designed to coact with an enlarged hooked portion on the elongated member for moving the elongated member relative to the housing member whereby the follower ramp and the cam ramp can coact to exert a force through the bearing surface of the elongated member against the printed circuit board. Additionally, the elongated bearing member can, if desired, provide an electrical contact to the printed circuit board.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

BRIEF DESCRIPTION OF THE DRAWINGS

FIG. 1 is a side view partially cut away of the printed circuit board retainer of the present invention;

FIG. 2 is a cross sectional view of the device of FIG. 1 taken along lines A—A; and FIG. 3 is another side view of the printed circuit board of the present invention.

DESCRIPTION OF THE PREFERRED EMBODIMENT

The following description is set forth to enable any person skilled in the art to make and use the invention and discloses the best mode contemplated by the inventor of carrying out his invention.

While the following parts which collectively constitute the present invention are preferably made from a cold rolled steel, it should be realized that other material, such as plastic, can be advantageously utilized.

Referring to FIG. 1, the printed circuit board retainer 2 includes a housing 4 having an elongated slot or opening 6 extending along one side of the housing 4 longitudinal axis. Side walls 8 and 10 of the housing 4 serve in a guiding or aligning function to be described subsequently. A rear wall 12 has impressed therein a plurality of cam ramps 14 and 16. The respective cam ramps 14 and 16 extend into the housing cavity 18 and in the preferred embodiment are stamped or pressed into the rear wall 12. Fastening ears 20 and 22 are formed on the housing 4 to permit the printed circuit board retainer 2 to be secured to an appropriate rack (not shown).

Mounted within the housing cavity 18 is an elongated clamping member 24. The clamping member 24 overlaps or covers the rear wall 12 relative to the opening 6 and has corresponding follower ramps 26 and 28 adapted to align and operatively coact respectively with the housing cam ramps 14 and 16. The elongated clamping member 24 also has a planar bearing surface 30 for exerting a clamping force against any printed circuit board 50 mounted within the housing cavity 18.

As can be seen in FIG. 1, it is possible by appropriate choice of material and insulation to connect the clamping member 24 to a source of power 60. In this embodiment of the present invention, the clamping member 24 not only secures the printed circuit board 50 but also energizes the circuit.

Referring to FIG. 2, the mounting of the elongated clamping member 24, within the housing 4 is clearly illustrated.

The elongated clamping member 24 has an enlarged hooked portion 32 that is designed to extend outside of the housing cavity 18 and be limited in its travel or movement by the coaction of the edge 34 of the housing rear wall 12 with the shoulder 36 of the hooked portion 32.

A U-shaped cam lever 38 is pivotally mounted on the housing 4 by means of a pivot pin 40. Mounted within the walls of the cam lever 38 is a bearing pin 42 that is adapted to coact with the hooked portion 32 of the elongated clamping member 24. As can be seen in FIGS. 2 and 3, the bearing pin 42 rotates about the fixed pivot pin 40 and is juxtapositioned relative to the hooked portion 32 to engage and lift the elongated clamping member 24 as the cam lever 38 rotates in a clockwise direction in the position shown in FIG. 3. The upward movement of the elongated clamping member 24 effectively disengages the respective cam ramps 16 and 14 from the follower ramps 28 and 26 and releases any clamping forces being applied through the planar bearing surfaces 30 to the printed circuit board 50.

Referring to FIG. 2, when the cam lever 38 is moved in a counterclockwise direction the bearing pin 42 bears against the upper surface of the elongated clamping member 24 to force the respective relatively rigid cam ramps and follower ramps to coact and produce a lateral force against any printed circuit board 50 positioned within the housing slot 6.

The arrangement of the individual parts of the present invention is highly advantageous in both the manufacturing and the assembling of a relatively inexpensive printed circuit board retainer. The elongated clamping member 24 with its enlarged hooked portion 32 is secured at only one end of the housing 4. During assembly the elongated member 24 is inserted within the housing cavity 18 and simply rests with its shoulder 36 bearing against the top edge 34 of the rear wall 12. The cam lever 38 with the bearing pin 42 securely positioned therein is then connected to the housing member by the pivot pin 40. With the cam lever 38 mounted on the housing 4, the elongated clamping member 24 is securely maintained within the housing cavity 18. The side walls 8 and 10 of the housing 4 maintain the elongated clamping member 24 in an overlapping relationship with the rear wall 12 of the housing member 4.

As a result of the present invention, a relatively inexpensive and easily manufactured printed circuit board retainer is provided. The printed circuit board retainer provides a positive holding force to maintain a printed circuit board within an appropriate rack. At the same time by the simple movement of a cam lever a printed circuit board can be easily removed from the rack. In addition, power can be supplied to the printed circuit board by the clamping member.

As can be readily appreciated, it is possible to deviate from the above embodiments of the present invention and as will be readily understood by those skilled in the art the invention is capable of many modifications and improvements within the scope and spirit thereof. Accordingly, it will be understood that the invention is not to be limited by the specific disclosed embodiment but only by the scope and spirit of the appended claims.

What is claimed is:

1. A printed circuit board retainer comprising: activating means mounted on the housing member; a housing member having a longitudinal axis; a relatively rigid clamping member attached only at one end to the activating means, at least one of the housing member and the clamping member has at least one cam ramp while the other member has at least one complementarily follower adapted to operatively coact with the cam ramp to provide a transverse movement relative to the longitudinal axis of the clamping member, the other end of the clamping member being unrestrained relative to the housing member; guide means maintaining one member in an operative relationship relative to the other member; means for receiving a printed circuit board; and means on said activating means for moving the entire rigid locking member in response to movement of the activating means relative to the housing member in the direction of the longitudinal axis whereby the clamping member exerts a lateral force for retaining the printed circuit board.

2. The invention of claim 1 wherein the guide means maintains one member in an overlapping relationship relative to the other member.

3. The invention of claim 1 wherein the means for moving the locking member includes a camming device.

4. The invention of claim 3 wherein the means for receiving a printed circuit board includes a bearing surface extending at least partially across the relatively movable members for supporting one side of the printed circuit board as a retaining force is exerted on the other side.

5. The invention of claim 3 wherein the means for moving the locking member includes a rotatably mounted cam lever.

6. The invention of claim 1 further including a power connection member attached to the clamping member for supplying power to the printed circuit board.

7. The invention of claim 4 wherein the locking member has a hooked end for coacting with the camming device for moving the locking member relative to the housing member.

8. The invention of claim 7 wherein the means for moving the members includes a rotatable cam lever having a projection for entering the hooked end and moving the member.

9. The invention of claim 7 wherein the cam device includes a lever pivotably attached to the housing member for securing the locking member in the housing member and further, includes a projection pin attached to the lever for coacting with the hooked end of the locking member.

10. The invention of claim 9 wherein the housing member has a plurality of cam ramps and the locking member has a corresponding member of complementarily followers.

11. A printed circuit board retainer comprising:
a movable elongated member having at least one follower ramp and a bearing surface; a housing member having at least one complementary cam ramp extending from its surface and adapted to operatively coact with the follower ramp and an opening extending along at least one side of the housing member to permit a printed circuit board to extend into and at least partially across the elongated member;
a cam lever mounted on the housing member, the elongated member having an enlarged head at one end for positioning the member in the housing; and the elongated head attached to said cam lever with the opposite end of said elongated member extending freely within the housing,
means for coacting with the cam lever for moving the entire elongated member along its longitudinal axis relative to the housing member including the follower ramp so that it will coact with the cam ramp to force the bearing surface of the elongated member against the printed circuit board positioned in the housing member transversely of said longitudinal axis.

12. The invention claim 11 wherein the enlarged head is hooked shaped.

13. The invention of claim 11 wherein the follower ramp is a portion of the housing member.

14. The invention of claim 12 wherein the enlarged head extends beyond the housing and seats on one end of the housing.

15. The invention of claim 14 wherein the cam lever also retains the elongated member within the housing.

16. The invention of claim 15 wherein the cam lever includes a pin and the cam lever is only fastened to the housing by the pin.

* * * * *